United States Patent
Chumbley et al.

(10) Patent No.: US 7,676,203 B2
(45) Date of Patent: Mar. 9, 2010

(54) METHOD AND APPARATUS FOR DYNAMICALLY TUNING RADIO STATIONS WITH USER-DEFINED PLAY LISTS

(75) Inventors: Robert Bryant Chumbley, Cedar Park, TX (US); Merle Douglas Sterling, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/015,215

(22) Filed: Jan. 16, 2008

(65) Prior Publication Data

US 2008/0133371 A1    Jun. 5, 2008

Related U.S. Application Data (63) Continuation of application No. 10/347,782, filed on Jan. 17, 2003, now Pat. No. 7,346,320.

(51) Int. Cl.
*H04B 1/18* (2006.01)
*H04B 7/00* (2006.01)
*H04H 40/00* (2008.01)
*G06F 17/00* (2006.01)

(52) U.S. Cl. .................. 455/186.1; 370/310; 455/3.06; 455/161.2; 700/94

(58) Field of Classification Search ........................ None
See application file for complete search history.

(56) References Cited

U.S. PATENT DOCUMENTS

| | | | |
|---|---|---|---|
| 6,248,946 | B1 | 6/2001 | Dwek |
| 6,381,314 | B1 | 4/2002 | Walinski |
| 6,907,397 | B2 | 6/2005 | Kryze et al. |
| 7,017,120 | B2 | 3/2006 | Shnier |
| 2002/0138630 | A1 | 9/2002 | Solomon et al. |
| 2003/0014767 | A1 | 1/2003 | Stumphauzer, II |
| 2003/0093790 | A1 | 5/2003 | Logan et al. |
| 2003/0112927 | A1 | 6/2003 | Brown et al. |
| 2004/0034711 | A1 | 2/2004 | Hughes |
| 2004/0171377 | A1 | 9/2004 | Engstrom |
| 2005/0083870 | A1 | 4/2005 | Koga et al. |

*Primary Examiner*—Kwang B Yao
*Assistant Examiner*—Jutai Kao
(74) *Attorney, Agent, or Firm*—Yee & Associates, P.C.; Libby Z. Handelsman (57) ABSTRACT

A method, apparatus, and computer instructions for dynamic radio station tuning in a data processing system. A play list is identified. The play list is a user-defined list and includes an identification of a number of songs. Music information is obtained from a plurality of radio stations. This music information is compared to the play list to generate a schedule. Dynamic tuning to a radio station within the plurality of radio stations is performed using the schedule to present songs from the number of songs to a listener.

12 Claims, 4 Drawing Sheets

METHOD AND APPARATUS FOR DYNAMICALLY TUNING RADIO STATIONS WITH USER-DEFINED PLAY LISTS

This application is a continuation of application Ser. No. 10/347,782, filed Jan. 17, 2003, now U.S. Pat. No. 7,346,320 status allowed.

BACKGROUND OF THE INVENTION

1. Technical Field

The present invention relates generally to an improved data processing system and in particular to a method and apparatus for receiving data. Still more particularly, the present invention relates to a method and apparatus for dynamically tuning a radio station based on user-defined play lists.

2. Description of Related Art

Music is broadcast or transmitted to listeners through many different mediums. The traditional radio broadcast medium uses AM or FM frequencies to broadcast music for listening by users at home or in vehicles. Another medium for broadcasting music is satellite radio. Rather than broadcasting content from antennas located on the ground, signals are transmitted through a satellite, allowing listeners to hear a broadcast from a station many miles away. This radio satellite broadcast system allows a listener to receive a particular station over long distances. With traditional radio signals transmitted from ground-based sources, these types of signals may travel only 30 to 40 miles from the source. In contrast, a satellite radio signal may be broadcast across a continent. Another source of music comes from the proliferation of streaming audio websites on the Internet. A user connected to the Internet may receive programming from a radio station from anywhere on the earth. With these types of broadcast systems, a user currently has no way to control the order in which songs are received or what songs are heard. Broadcasts are sent over the different mediums in the order selected by the radio station. Thus, with any of these systems, a user is required to manually tune or connect to a radio station that plays music of the desired genre and wait to hear a particular song. Some stations provide a play list on a global website to allow users to determine when a particular song will be played. This type of information is useful, but given the large number of available stations, it is impractical for a user to visit each of the websites for each station to read play lists to identify songs that the user wants to hear. Further, it is even more impractical for a user to visit websites while operating a vehicle. Attempting to review websites for play lists provided by radio stations is impractical because of the dangers of not focusing attention on the road.

Therefore, it would be advantageous to have an improved method and apparatus for identifying and dynamically tuning to radio stations for broadcasts desired by a user.

SUMMARY OF THE INVENTION

The present invention provides a method, apparatus, and computer instructions for dynamic radio station tuning in a data processing system. A play list is identified. The play list is a user-defined list and includes an identification of a number of songs. Music information is obtained from a plurality of radio stations. This music information is compared to the play list to generate a schedule. Dynamic tuning to a radio station within the plurality of radio stations is performed using the schedule to present songs from the number of songs to a listener.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
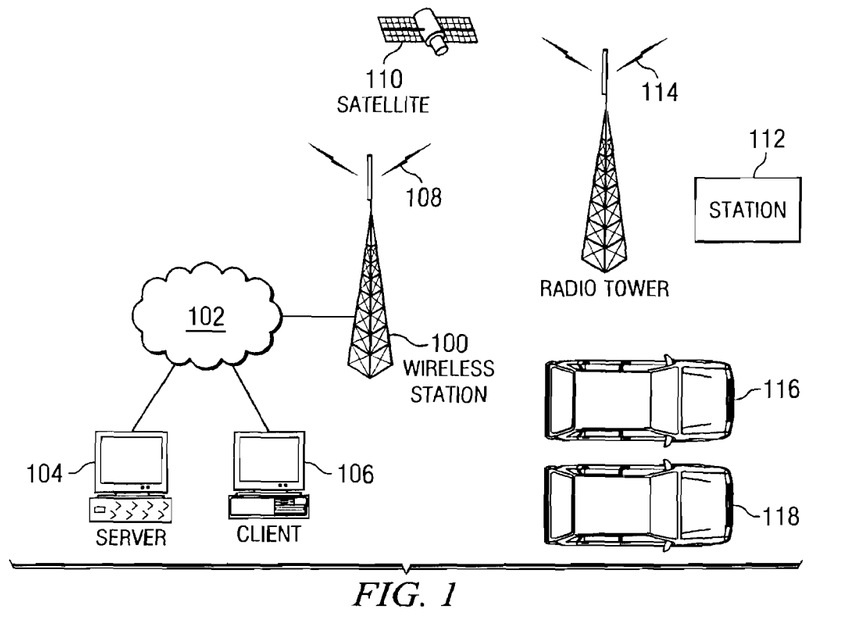
FIG. 1 is a block diagram of a distributed data processing system in which a preferred embodiment of the present invention may be implemented.

With reference now to the figures, FIG. 1 depicts a pictorial representation of a distributed data processing system in which the present invention may be implemented. Distributed data processing system 100 includes various broadcasting media from which a user may receive programming. In this example, data processing system 100 includes a network 102, which is a medium used to provide communication links between various devices in computers connected together within distributed data processing 100. Network 102 may include connections, such as wire, wireless communication links, or fiber optic cables. In this example, network 102 provides for streaming of music from a source, such as server 104 to a client, such as client 106. Additionally, the programming may be streamed or sent through a wireless communications link, such as one provided by wireless station 108. Programming is received from server 104 by tuning or connecting to an Internet Protocol (IP) address assigned to server 104. In this manner, the user at client 106 may receive radio station broadcasts from server 104 through network 102.

Additionally, distributed data processing system 100 also includes a satellite radio system in which satellite 110 transmits programming to various users. Further, distributed data processing system 100 also includes a more traditional broadcast system in which station 112 transmits music programming through AM or FM transmissions over radio tower 114. All three of these types of broadcast may be received by various clients, such as those in vehicles 116 and 118 in addition to client 106.

In the depicted example, network 102 may be implemented using the Internet, representing a world-wide collection of networks and gateways that use the Transmission Control Protocol/Internet Protocol (TCP/IP) suite of protocols to communicate with one another. At the heart of the Internet is a backbone of high speed data communication lines between major nodes or host computers, consisting of thousands of commercial, government, educational, and other computer systems that route data and messages. Of course, network 102 can also be implemented using other networks in addition to or in place of the Internet. These networks may be, for example, an intranet, a local area network (LAN), or a wide area network (WAN). FIG. 1 is intended as an example of a distributed data processing system, and is not intended as an architectural limitation for the present invention.

The present invention provides a mechanism for locating stations that are or will be broadcasting music programming that match songs on a play list defined by a user. In these examples, this mechanism is implemented as a software application that runs on a personal computer, such as on client 106, or is embedded in the firmware of a home or car stereo system that includes tuning capabilities, such as Internet radio, satellite radio, or digital cable radio station tuning capabilities. The mechanism of the present invention provides a real-time scheduling capability for music broadcasts to allow a user to listen to desired songs without having to search for those songs on different radio stations. The mechanism of the present invention avoids requiring a user to search websites or manually tune stations to find songs that a user desires to hear.

Figure 2:
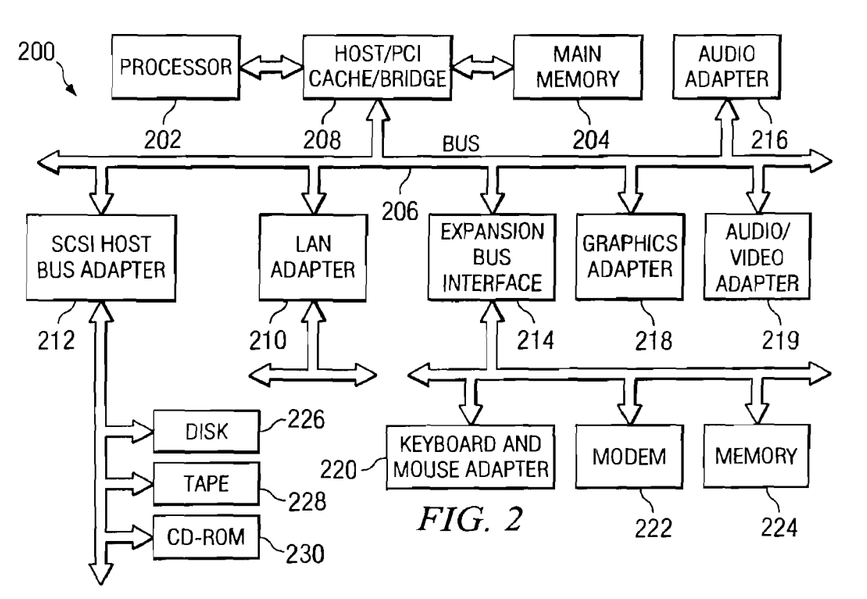
FIG. 2 is a block diagram depicting a data processing system in accordance with a preferred embodiment of the present invention.

With reference now to FIG. 2, a block diagram of a data processing system is shown in which the present invention may be implemented. Data processing system 200 is an example of a computer, such as client 106 in FIG. 1, in which code or instructions implementing the processes of the present invention may be located.

Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards.

In the depicted example, local area network (LAN) adapter 210, small computer system interface (SCSI) host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230.

An operating system runs on processor 202 and is used to coordinate and provide control of various components within data processing system 200 in FIG. 2. The operating system may be a commercially available operating system such as Windows XP, which is available from Microsoft Corporation. Instructions for the operating system and applications or programs are located on storage devices, such as hard disk drive 226, and may be loaded into main memory 204 for execution by processor 202.

The processes of the present invention are performed by processor 202 using computer implemented instructions, which may be located in a memory such as, for example, main memory 204, memory 224, or in one or more peripheral devices 226-230.

In this example, data processing system 200 may include computer instructions for an application to obtain music information identifying songs that are to be played, identify songs a user desires to hear, and dynamically tune or connect to those radio stations providing the songs at the appropriate times. In this example, data processing system 200 may tune to stations broadcasting music over the Internet. Additionally, depending on the particular types of components included in data processing system 200, data processing system 200 also may receive music programming through other mediums, such as, for example, satellite radio.

Those of ordinary skill in the art will appreciate that the hardware in FIG. 2 may vary depending on the implementation. Other internal hardware or peripheral devices, such as flash read-only memory (ROM), equivalent non-volatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM drive 230. In that case, the computer, to be properly called a client computer, includes some type of network communication interface, such as LAN adapter 210, modem 222, or the like. As a further example, data processing system 200 may be a personal digital assistant (PDA), which is configured with ROM and/or flash ROM to provide non-volatile memory for storing operating system files and/or user-generated data.

The depicted example in FIG. 2 and the above-described examples are not meant to imply architectural limitations. For example, data processing system 200 also may be a notebook computer or hand held computer in addition to taking the form of a PDA. Data processing system 200 also may be a kiosk or a Web appliance.

Figure 3:
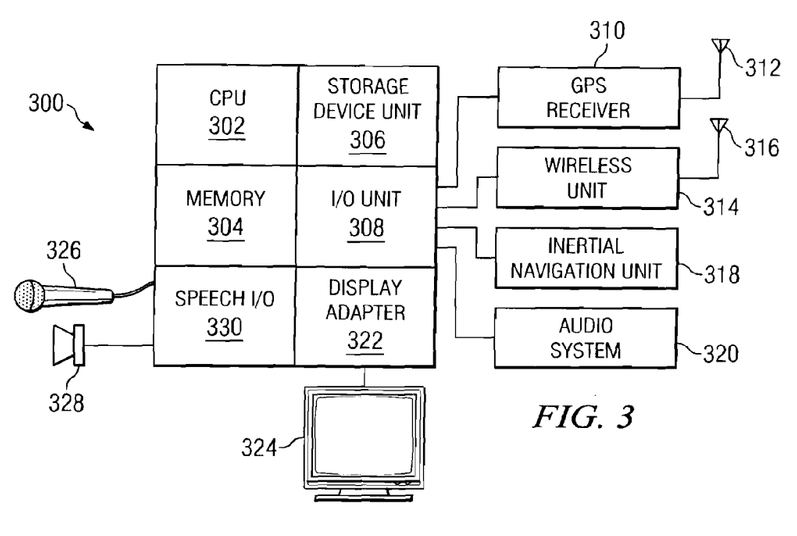
FIG. 3 is a block diagram of an automotive computing platform in accordance with a preferred embodiment of the present invention.

Turning next to FIG. 3, a block diagram of an automotive computing platform is depicted in accordance with a preferred embodiment of the present invention. Computing platform 300 is located within a vehicle, such as vehicle 118 in FIG. 1. Computing platform 300 includes a CPU 302, which may be an embedded processor or a processor, such as a Pentium processor from Intel Corporation. "Pentium" is a trademark of Intel Corporation. Computing platform 300 also includes memory 304, which may take the form of random access memory (RAM) and/or read-only memory (ROM).

Computing platform 300 also contains a storage device unit 306. Storage device unit 306 may contain one or more storage devices, such as, for example, a hard disk drive, a flash memory, a DVD drive, or a floppy disk. Computing platform 300 also includes an input/output (I/O) unit 308, which provides connections to various I/O devices. In this example, a GPS receiver, such as GPS receiver 310 is included within computing platform 300 and receives signals through antenna 312. Wireless unit 314 provides for two-way communications between computing platform 300 and another data processing system, such as sever 104 in FIG. 1. This communication may be established using TCP/IP protocols normally found on the Internet. Communications are provided through antenna 316. In addition, inertial navigation unit 318 is connected to I/O unit 308. Inertial navigation unit 318 is employed for navigation when GPS receiver 310 is unable to receive a usable signal or is inoperable.

Audio system 320 also is connected to I/O unit 308. Audio system 320 includes a radio that may be tuned to various radio stations via different mediums. Audio system 320 also may include other components, such as a CD-ROM player or an MP3 device. Audio system 320 may receive broadcasts from a variety of mechanisms. For example, audio system 320 may receive broadcasts via traditional airway broadcasts, such as AM or FM broadcasts, or satellite radio broadcasts. These traditional airway broadcasts are typically analog broadcasts, while the satellite radio broadcasts are digital ones. Also, audio system 320 may receive Internet broadcasts by tuning or connecting to IP addresses for desired radio stations. Internet connections may be established using any wireless connection system for Internet access. In these examples, dynamic tuning in audio system 320 may be controlled through CPU 302.

Computing platform 300 also includes a display adapter 322, which is connected to display 324. In the depicted example, this display is a touch screen display. Alternatively or in addition to a touch screen display, display 324 also may employ a heads-up display projected onto the windshield of the automobile. Computing platform 300 also includes a microphone 326 and a speaker 328 to provide a driver with the ability to enter commands and receive responses through speech I/O 330 without having to divert the driver's attention away from the road, or without the driver having to remove the driver's hands from the steering wheel.

In these examples, computer instructions may be included for execution by CPU 302 to obtain music information identifying songs that will be broadcast by different radio stations, identifying songs that a user desires to hear, and dynamically tuning to the appropriate radio station playing the desired songs at the appropriate time. Of course, depending on the type of data processing system included in a vehicle, the processes defined by the computer instructions may be implemented as firmware, located within audio system 320. In such a case, processing by CPU 302 is not required.

The present invention provides a method, apparatus, and computer instructions for locating stations that are or will be broadcasting songs that match those on a play list defined by a user. This mechanism provides for dynamic radio station tuning.

Figure 4:
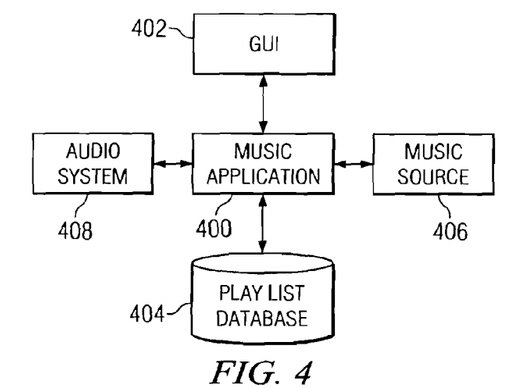
FIG. 4 is a block diagram illustrating components used in dynamic radio station tuning based on a user-defined play list in accordance with a preferred embodiment of the present invention.

Turning now to FIG. 4, a block diagram illustrating components used in dynamic radio station tuning based on a user-defined play list is depicted in accordance with a preferred embodiment of the present invention. The components illustrated in FIG. 4 may be implemented in various types of data processing systems, such as those illustrated in FIGS. 2 and 3 above.

Music application 400 may receive user input through graphical user interface (GUI) 402. The user input obtained from GUI 402 is employed to identify and generate play lists, containing songs that a user desires to hear. User input also may be received using other mechanisms, such as voice input. This information may include, for example, the track name of a song and the artist's name. This play list is stored in play list database 404 by music application 400.

Music information may be obtained from music source 406. This music source may include for example, Internet radio stations or websites provided by Internet radio stations. Additionally, this information also may be broadcast through satellite radio transmissions or normal transmissions. The music information may include, for example, a title, an artist's name, a length of the song or track, and the time at which the song is to be played. This music information may be received by music application 400 and stored in play list database 404.

This music information is compared to the play list defined by the user to identify songs matching those in the user-defined play list. The music information for music source 406 is also referred to as server or source side play lists. By comparing the global user-defined play list with the music information, music application 400 may build a data structure containing a scheduled time and server addresses or radio station addresses that correspond to the songs on the user-defined play list. The selection and schedule may differ depending on user preferences. For example, the user may or may not care in what order the songs are presented. The schedule may take various forms, such as a list of songs and playt times or may merely be a comparison of songs based on the user-defined play list and music information.

Music application 400 then uses that data structure to dynamically tune to the radio station at the times indicated by the data structure. Music application 400 may send the appropriate signals to audio system 408 to dynamically tune this audio system to present the songs desired to be heard by the user. In the event that multiple songs are available from different stations at roughly the same time, music application 400 may buffer those songs or save them to a storage device for playback at a later point in time.

Suppose that a user takes a long trip by car. Normally, the only choice of music available would be those broadcast stations that are in range of the car's FM stereo or perhaps satellite radio. The user has no control over what content is broadcast and must manually tune the radio to find selections of interest. As the trip progresses, some stations will go out of range while others will be coming in to range. Using the invention described above, the user could program the radio with a play list that include a large number of songs the user would like to hear during the trip and the radio would constantly scan the stations the system is aware of and try to match songs that are currently playing or will be broadcast soon and dynamically tune to the station that is playing one of the songs on the user's play list.

Using a user play list comprised of three songs, the scenario might be as follows: At 3:00 pm, based on the server side (radio) play lists, the application/stereo system determines that song 1 will be broadcast at 3:02 pm from station A and is 4 minutes in length, song number 2 will be broadcast at 3:10 pm on station B and is 3 minutes in length, and song number 3 will be broadcast at 3:06 pm on station C and is 4 minutes in length. Given this schedule, the radio would be tuned to Station A at 3:02 and the user would hear song 1. The radio switches to station C at 3:06 pm and the user hears song 3. Finally, the radio would be tuned to Station B at 3:10 pm, and the user hears song 2.

Figure 5A:
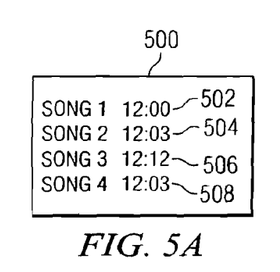
FIGS. 5A and 5B are diagrams illustrating a presentation of a play list to a user is depicted in accordance with a preferred embodiment of the present invention.
Figure 5B:
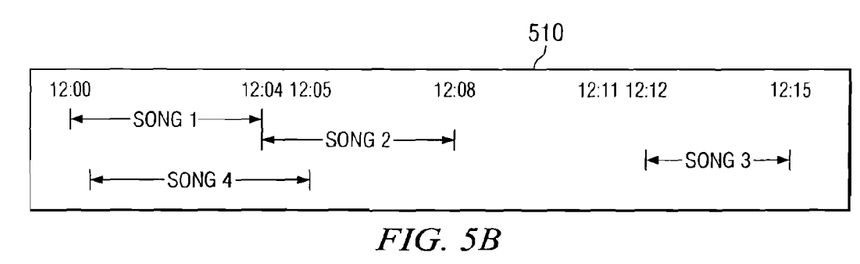

Turning next to FIGS. 5A and 5B, diagrams illustrating a presentation of a play-list to a user is depicted in accordance with a preferred embodiment of the present invention. Play lists 500 and 510 are examples of play lists that may be presented to a user by music application 400 in FIG. 4 through GUI 402 in FIG. 4. Play list 500 in FIG. 5A is presented in a list form identifying song names and play times. In this example, play list 500 includes entries 502, 504, 506, and 508. As illustrated, the song in entry 508 plays at a time that conflicts with songs in entries 502 and 504. In such a case, the song in entry 508 may not be presented or alternatively may be buffered or stored for later presentation.

Song 1 in entry 502 is scheduled to play from 12:00 to 12:04, song 2 in entry 504 is scheduled to play from 12:05 to 12:08, no songs are available from 12:09 to 12:11 in this example. Finally, song 3 in entry 506 is scheduled to play from 12:12 to 12:15. Song 4 in entry 508 is scheduled to play from 12:02 to 12:05, but conflicts with other choices. In this case, one alternative is to allow a user to pick which songs will be presented or to buffer song 4 for later playback. Another alternative includes skipping 4 in entry 508 entirely. Alternatively, play lists may include ratings to allow a user to indicate preferences. Also, in dead air time, advertisements, music stored locally or any other song in a user specified default station may be played during the time which no songs match a user-defined play list.

Play list 510 in FIG. 5B is in the form of a Gantt chart providing start and end times for the presentation of different songs. These songs include the same start times as illustrated in play list 500. As can be seen, song 4 in play list 510 clearly shows a conflict in play time with song 1 and 2. Such a presentation provides an alternative presentation of information to a user. Of course, play lists may be presented in many different ways including an audible presentation in which the play list and times are presented through text to speech conversions.

Figure 6A:
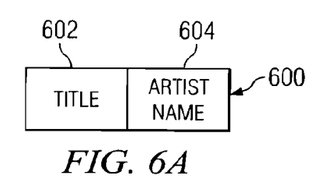
FIG. 6A is an example of an entry that may be generated for a user-defined play list in accordance with a preferred embodiment of the present invention.
Figure 6B:
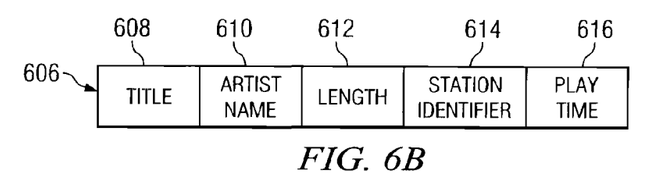
FIG. 6B is a diagram of an entry of a data structure generated by comparing a user-defined play list with music information in accordance with a preferred embodiment of the present invention.

Turning next to FIG. 6A, entry 600 is an example of an entry that may be generated for a user-defined play list in accordance with a preferred embodiment of the present invention. In this example entry 600 includes title 602 and artist name 604. Turning to FIG. 6B, a diagram of an entry of a data structure generated by comparing a user-defined play list with music information is depicted in accordance with a preferred embodiment of the present invention. Entry 606 includes title 608, artist name 610, length 612, station identifier 614, and play time 616. Title 608 and artist name 610 are used to identify songs that are to be played by radio stations for comparison with songs identified as desired by the user in a user-defined play list. Length 612 identifies the length or time that the songs last while play time 616 identifies when the song is to be broadcast or streamed. Station 614 identifies the station. This identification may take different forms, for example, an IP address or a frequency for a radio station. The play time in length 612 is used to build a schedule for dynamically tuning stations for a user. If an overlap in songs occurs, songs may be stored or buffered for playback after a currently played song in order to present all of the user's songs on a user-defined play list.

Figure 7:
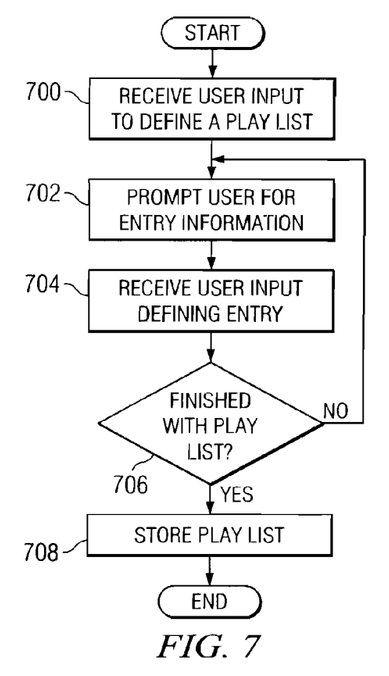
FIG. 7 is a flowchart of a process used for creating a user-defined play listed in accordance with a preferred embodiment of the present invention.

Turning now to FIG. 7, a flowchart of a process used for creating a user-defined play list is depicted in accordance with a preferred embodiment of the present invention. The process illustrated in FIG. 7 may be implemented in a music application, such as music application 400 in FIG. 4.

The process begins by receiving user inputs to define a play list (step 700). Thereafter, the user is prompted to enter information (step 702). In step 702, the user may enter information, such as the name of the track or song and the name of the artist. The user input defining the entry is then received from the user (step 704). This information is used to create an entry in a user-defined play list, such as entry 600 in FIG. 6A. A determination is then made as to whether the user is finished with the user-defined play list (step 706). If the user has finished creating the play list, the play list is stored (step 708) with the process terminating thereafter. Otherwise, the process returns to step 702 to prompt the user for information for another entry of information for another song.

Figure 8:
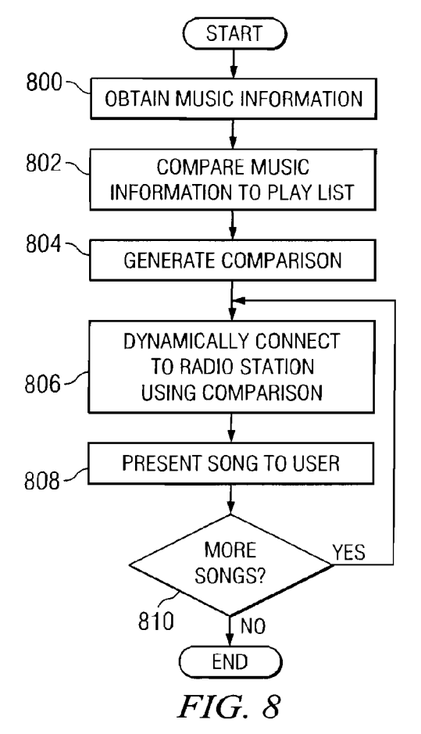
FIG. 8 is a flowchart of a process for dynamic radio station tuning in accordance with a preferred embodiment of the present invention.

Turning now to FIG. 8, a flowchart of a process for dynamic radio station tuning is depicted in accordance with a preferred embodiment of the present invention. The process illustrated in FIG. 8 may be implemented in a music application, such as music application 400 in FIG. 4.

The process begins by obtaining music information (step 800). Music information may be obtained from various sources depending on the particular implementation. For example, music information in the form of play lists for songs that are to be played by a radio station may be obtained from a website in some cases. In other cases, the stations may transmit music information along with the song that is being played, allowing identification of the song by data processing system.

Next, the music information is compared to the user-defined play list (step 802). A comparison is generated (step 804). This comparison includes generating a data structure containing a schedule of songs for presentation to a user. This data structure contains a play list that is used to present songs to the user. In some cases, the music information provided by the radio source may include start time that encompasses a commercial as well the desired song. For example, the music information may indicate that a song starts at 9:15 when in actuality a commercial begins at 9:15 and the desired song starts at 9:16. In other cases, a small charge may be made for the music information. For example, groups of stations and/or websites may join and the information used for dynamic radio tuning "members". A member may be for example a member of a given site. In such as case, a member would have access to all of the other participating sites as well. This arrangement may provide value when compared against other sites that do not provide the capability. As in any affinity type program, different tiers of membership may be defined. A basic user (pays the least, perhaps) is presented with commercials at predetermined intervals, while higher paying members may be subject to commercials more infrequently or not at all. In this manner, radio stations may generate revenue both via commercials and via paying members.

A dynamic connection is made to a radio station using the comparison (step 806). In step 806, this dynamic connection, as used herein, means to start streaming the song from the source. The source may be either a remote location or from a local file if the song has been buffered. A dynamic connection to a remote location may be made by tuning to the appropriate source. With a locally stored or buffered song, the location may be a file name or a path. The tuning may be performed by a music application, such as music application 400 in FIG. 4, controlling an audio system, such as audio system 408 in FIG. 4. Thereafter, the song is presented to the user on the audio system (step 808). A determination is then made as to whether additional unprocessed songs are present on the play list (step 810). If additional songs are not present on the play list, the process terminates. Otherwise, the process returns to step 806 to dynamically connect to a radio station for the next song on the play list after completion of presentation of the present song.

Of course, the mechanism of the present invention may be implemented in a manner such that one or more songs in a play list may be buffered if those songs are available at roughly the same time from different stations. This buffering may occur in the event that the audio system has more than one tuner or that broadcasts are received both from satellite radio or a traditional radio system and an Internet radio system. In other words, if an overlap between two songs on the play list occurs, one of those two songs may be buffered or stored for presentation at a later point.

Figure 9:
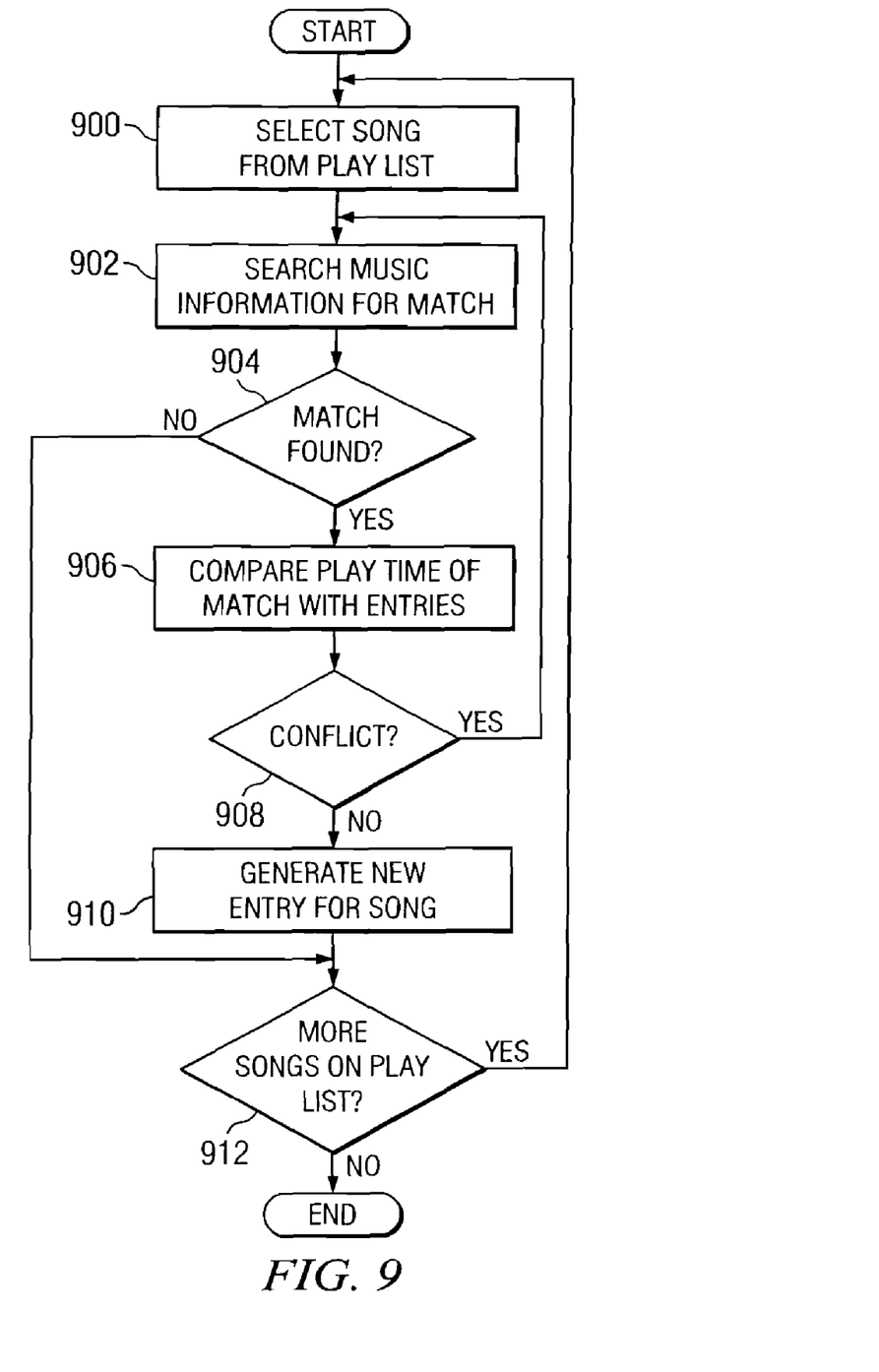
FIG. 9 is a flowchart of a process for generating a comparison in accordance with a preferred embodiment of the present invention.

Turning now to FIG. 9, a flowchart of a process for generating a comparison is depicted in accordance with a preferred embodiment of the present invention. The process illustrated in FIG. 8 is a more detailed description of step 804 in FIG. 8. The results of the comparison may form a schedule used for dynamic tuning to present songs to a user.

The process begins by selecting a song from the user-defined play list (step 900). Next, a search of music information is made to search for a match (step 902). In these examples, a match may occur if the name of a song on the user generated play list matches the name of a song in the music information. For a more accurate comparison, a match with an artist name also may be made to ensure that the same song sung by another artist is not selected. A determination is made as to whether a match has been found (step 904).

If a match occurs, then a comparison of the play time for the matching song is made with the current entries in the schedule (step 906). In these examples, the play time is the time at which the song is to be broadcast or streamed from the radio station. This play time is compared with those of other songs already presently placed in the list of matching entries. This comparison is made to identify whether any overlap occurs between the matching song found from the music information and any entries currently present in the play list. A determination is made as to whether a conflict in the play time is present (step 908). If a conflict in play time is not present, a new entry is generated for the song identified as being a match (step 910). Alternatively, if a conflict is identified, an additional step may be included in which this song is included in an entry for buffering with the process then returning to step 908 as described above. In this fashion, the process would later connect to the music source, download the song and then save it to local storage. Entries in the play list generated for presentation to the user may be updated to indicate that the music is now stored in a local storage.

Thereafter, a determination is made as to whether more songs are present on the user-defined play list that have not been processed (step 912). If no additional songs are present on the user-defined play list, the process terminates. Otherwise, the process returns to step 900 to select a song from the play list. With reference again to step 908, if a conflict is present, the process returns to step 902 to search the music information for another match. If a conflict is present between the current match and another song and artist in the play list, another match for the desired song by the artist may be found in which the song is played at a different time to avoid the conflict. With reference to step 904, if a match is not present, the process proceeds to step 912 as described above.

The steps illustrated in the flowcharts for obtaining music lists and generating song entries for a play list for presentation to a user may be implemented in many ways. In these examples, these processes may be implemented as an ongoing process that continues in the background while songs are currently being presented. Additionally, playback may begin as soon as the first song is found for a play list with the search and compare process continuing in the background to update the play list.

Other mechanisms other than buffering may be used. For example, skipping of conflicting songs or picking a song with the highest rating in the user defined play list. Further, songs may be selected between conflicting matches based on preferring songs of one genre to another. These type of preferences may be entered by the user and implemented for resolving conflicts.

Thus, the present invention provides an improved method, apparatus, and computer instructions for dynamic radio station tuning based on user-defined play lists. The mechanism of the present invention obtains music information from various sources. The mechanism of the present invention may scan lists of known Internet radio stations and retrieve play lists from those stations. These radio station play lists are examined and compared with a user-defined play list to generate a schedule of times and radio station identifiers that correspond to the songs on the user play list. The identification may be an IP address or a frequency for a radio station depending on the particular radio station. In this manner, the mechanism of the present invention will then dynamically tune to the appropriate radio station and download or send the song to the user for presentation.

Again, as mentioned before in the event that multiple songs are available from different stations at roughly the same time, the songs may be buffered or saved for playback at a later point. In this manner, a user, especially one in a vehicle, may have songs presented without the user having to search for or scan radio stations for desired songs.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such as a floppy disk, a hard disk drive, RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A data processing for dynamic radio station tuning, the data processing system comprising:
    a bus system;
    a communications unit connected to the bus system;
    a memory connected to the bus system, wherein the memory includes a set of instructions; and
    a processing unit connected to the bus system, wherein the processing unit executes the set of instructions to generate a play list, wherein the play list includes an identification of a number of song—and wherein the step of generating the play list includes gathering user input through the use of a touch screen display or through voice input; obtain music information from a plurality of radio stations; compare the music information to the play list to generate a schedule, wherein the schedule contains a listing of all songs matching the play list and the music information arranged based on a time the songs are to be played on the plurality of radio stations, and wherein a data structure is generated to store the schedule; dynamically tune to a radio station within the plurality of radio stations using the schedule in which songs from the number of songs are presented to a user as soon as a first song is found matching the play list; playing songs stored locally during a time when no music information matches the play list; and repeating the steps of obtaining music information and comparing the music information to the play list to update the schedule in a background process while songs are being presented to the user.

2. A data processing system for dynamic radio station tuning, the data processing system comprising:
identifying means for generating a play list, wherein the play list includes an identification of a number of song and wherein the step of generating the play list includes gathering user input through the use of a touch screen display or through voice input;
obtaining means for obtaining music information from a plurality of radio stations;
comparing means for comparing the music information to the play list to generate a schedule, wherein the schedule contains a listing of all songs matching the play list and the music information arranged based on a time the songs are to be played on the plurality of radio stations, and wherein a data structure is generated to store the schedule;
tuning means for dynamically tuning to a radio station within the plurality of radio stations using the schedule, wherein songs from the number of songs are presented to a user as soon as a first song is found matching the play list;
playing songs stored locally during a time when no music information matches the play list; and
repeating the steps of obtaining music information and comparing the music information to the play list to update the schedule in a background process while songs are being presented to the user.

3. The data processing system of claim 2, wherein the dynamically tuning means connects to an Internet Protocol address for the radio station.

4. The data processing system of claim 2, wherein the plurality of radio stations includes at least one of an Internet radio station, a satellite radio station, and a broadcast radio station.

5. The data processing system of claim 2, wherein the music information includes a name.

6. The data processing system of claim 5, wherein the music information further includes at least one of an artist name, a track number, a track length, and a time of broadcast.

7. The data processing system of claim 2, wherein the data processing system is selected from one of a personal computer, an audio system, or an automotive computing platform.

8. The data processing system of claim 2, wherein the generating means comprises:
prompting means for prompting the user to input the identification of the number of songs; and
generating means for generating the play list from input from the user.

9. The data processing system of claim 2, wherein the dynamically tuning means includes:
storing means for storing a song if the song overlaps with another song in the schedule.

10. The data processing system of claim 2, wherein the music information includes at least one of a start time for a song that includes a commercial.

11. The data processing system of claim 2 further comprising:
presenting means for presenting a commercial identified from the music information during a period of time when no songs are to be presented to the user.

12. A computer program product stored in a computer readable medium, wherein the computer program product executes the set of instructions for dynamic radio station tuning, the set of instructions comprising:
first instructions for generating a play list, wherein the play list includes an identification of a number of song, and wherein the step of generating the play list includes gathering user input through the use of a touch screen display or through voice input;
second instructions for obtaining music information from a plurality of radio stations;
third instructions for comparing the music information to the play list to generate a schedule, wherein the schedule contains a listing of all songs matching the play list and the music information arranged based on a time the songs are to be played on the plurality of radio stations, and wherein a data structure is generated to store the schedule;
fourth instructions for dynamically tuning to a radio station within the plurality of radio stations using the schedule, wherein songs from the number of songs are presented to a user as soon as a first song is found matching the play list;
fifth instructions for playing songs stored locally during a time when no music information matches the play list; and
sixth instructions for repeating the steps of obtaining music information and comparing the music information to the play list to update the schedule in a background process while songs are being presented to the user.

* * * * *